(12) United States Patent
Kao

(10) Patent No.: US 7,522,073 B1
(45) Date of Patent: Apr. 21, 2009

(54) SELF-ADAPTED BUS INVERSION

(75) Inventor: Rom-Shen Kao, Durham, NC (US)

(73) Assignee: Qimonda North America Corp., Cary, NC (US)

( * ) Notice: Subject to any disclaimer, the term of this patent is extended or adjusted under 35 U.S.C. 154(b) by 0 days.

(21) Appl. No.: 11/947,914

(22) Filed: Nov. 30, 2007

(51) Int. Cl.
*H03M 5/00* (2006.01)

(52) U.S. Cl. .............................. 341/55; 341/56; 341/58; 710/104; 710/105; 710/110; 710/119; 714/761; 714/752

(58) Field of Classification Search .................... 341/55, 341/56, 58; 710/110, 104, 105, 111, 199; 714/761–763, 752–754
See application file for complete search history.

(56) References Cited

U.S. PATENT DOCUMENTS

| | | | | | |
|---|---|---|---|---|---|
| 7,280,412 | B2* | 10/2007 | Jang et al. | .............. | 365/189.07 |
| 7,400,541 | B2* | 7/2008 | Jang et al. | .............. | 365/189.07 |
| 7,408,483 | B2* | 8/2008 | Lee | .............. | 341/55 |
| 2004/0012583 | A1* | 1/2004 | Teshirogi et al. | .............. | 345/204 |
| 2005/0256325 | A1* | 11/2005 | Jadav et al. | .............. | 552/581 |
| 2007/0242508 | A1* | 10/2007 | Bae | .............. | 365/184 |
| 2007/0290902 | A1* | 12/2007 | Bae et al. | .............. | 341/101 |
| 2008/0162778 | A1* | 7/2008 | Choi et al. | .............. | 711/100 |
| 2008/0288844 | A1* | 11/2008 | Nieuwland | .............. | 714/746 |

* cited by examiner

*Primary Examiner*—Linh V Nguyen
(74) *Attorney, Agent, or Firm*—Patterson & Sheridan, L.L.P.

(57) ABSTRACT

Embodiments of the invention generally provide methods, systems, and articles of manufacture for selecting a data bus inversion (DBI) mode of operation. A comparison circuit of a device may receive multiple packets of data to be transmitted to another device over a bus connecting the devices. The comparison circuit may compare the multiple packets of data and select a DBI mode of operation that conserves power and reduces noise on the bus.

27 Claims, 5 Drawing Sheets

302 — PREVIOUS BYTE
301 — CURRENT BYTE
303 — DIFFERENCE
304 — INVERSED BYTE

202 — HIGH LEVEL
201 — CURRENT BYTE
203 — DIFFERENCE
204 — INVERSED BYTE

US 7,522,073 B1

SELF-ADAPTED BUS INVERSION

BACKGROUND OF THE INVENTION

Modern electronic devices generally contain one or more devices that communicate with each other over a bus. For example, a computer generally comprises a processor that communicates with a memory device over a bus to access programs and data contained in the memory device. The performance of modern electronic devices such as processors and memories continues to improve by operating the devices at higher clock speeds and/or widening the bus connecting the devices. Increasing clock speed and widening the bus, however, result in increased power consumption by the bus. Furthermore, the toggling of bits on the bus during sequential data transmissions may generate noise on the bus.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
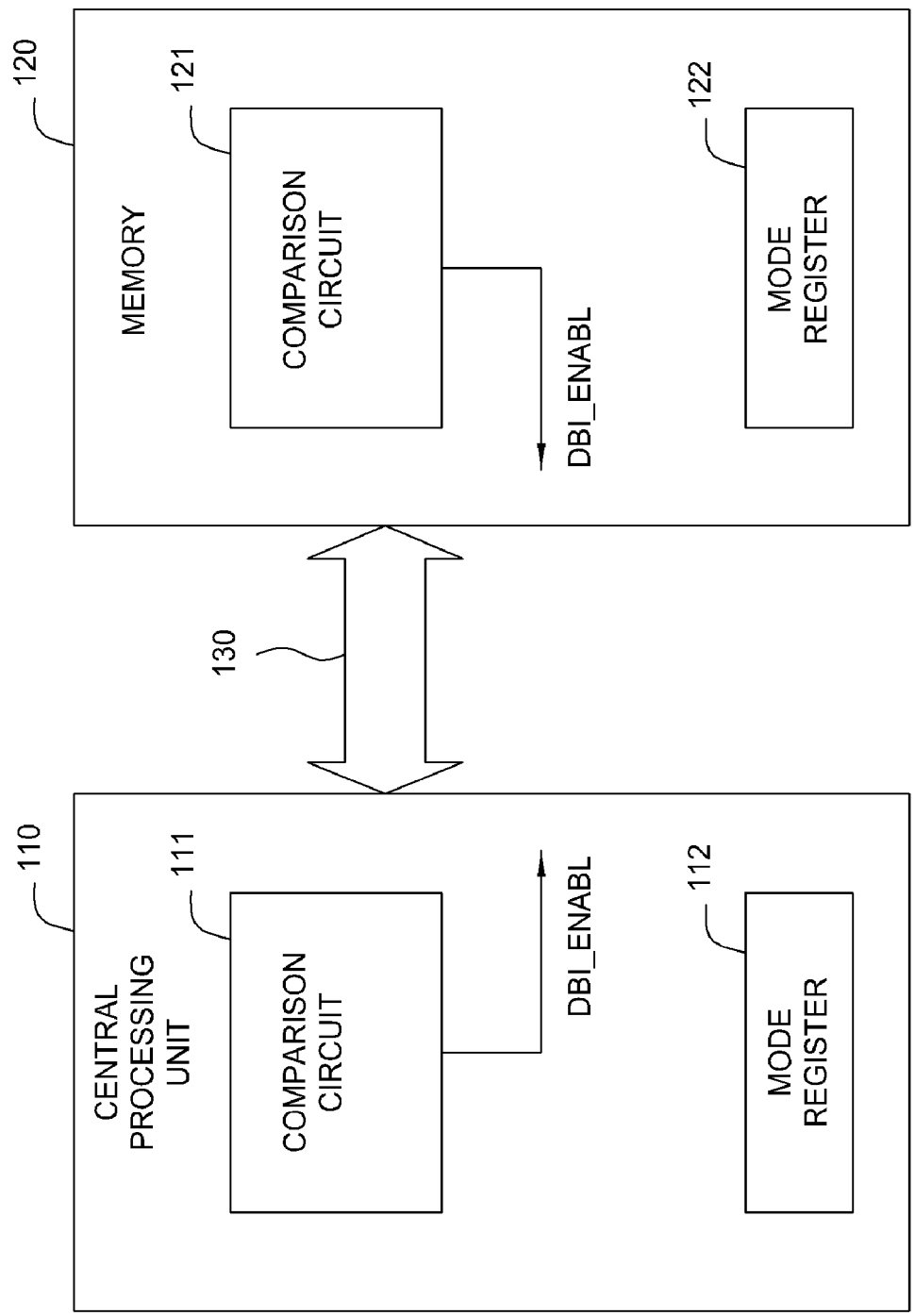
FIG. 1 illustrates an exemplary system according to an embodiment of the invention.

Embodiments of the invention generally provide methods, systems, and articles of manufacture for selecting a data bus inversion (DBI) mode of operation. In one embodiment, a comparison circuit of a device may receive multiple packets of data to be transmitted to another device over a bus connecting the devices. The comparison circuit may compare the multiple packets of data and select a DBI mode of operation that conserves power and reduces noise on the bus.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Embodiments of the invention may generally be used with any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

Whether the memory is integrated into a device with other circuits or is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices, typically referred to as a multi-chip package. Devices within the multi-chip package may be connected via wire bonds or other types of connections to a circuit board with one or more layers of interconnections. The devices and the circuit board may be enclosed within a packaging material such as a molded encapsulant or a ceramic packaging material. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and nonvolatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (Fe-RAM), phase-change RAM (PRAM), electrically erasable programmable read-only memory (EEPROM), laser programmable fuses, electrically programmable fuses (e-fuses), and any other types of nonvolatile memory.

FIG. 1 illustrates a system 100 according to an embodiment of the invention. System 100 may include a plurality of devices interconnected by one or more buses. For example, a device 110 is shown connected to a device 120 by a bus 130 in FIG. 1. In one embodiment of the invention, device 110 may be a central processing unit (CPU) and device 120 may be a memory device 120. For the sake of convenience, the devices 110 and 120 are hereinafter referred to as CPU 110 and memory 120. However, embodiments of the invention are not limited to CPUs and memories. Rather, embodiments of the invention may be implemented with any system device that is configured to communicate with another system device over a bus.

Memory 120 is preferably a random access memory, for example, a dynamic random access memory (DRAM); however, more generally, memory 120 may be any type of memory listed above, including flash memory. While the memory 120 is shown as a single entity, it should be understood that the memory 120 may in fact comprise a plurality of modules, and that the memory 120 may exist at multiple levels, from high speed registers and caches to lower speed but larger DRAM chips.

Memory 120 may contain programs and data for performing one or more functions of the system. For example, in one embodiment, memory 120 may contain code and data to facilitate graphics processing such as, for example, manipulating objects displayed on a display screen or monitor. To access the code and data stored in memory 120, CPU 110 may be configured to issue one or more commands to memory 120 via the bus 130. For example, the CPU 110 may be configured to issue read and write commands to transfer data to, and retrieve data from, memory 120.

The bus 130 may include a plurality of parallel lines. In one embodiment, the bus 130 may include a control bus, address bus and/or a data bus. A control bus may be used to exchange control signals, for example, write enable, chip select, data available, and the like. The address bus may be configured to transfer an address representing a memory location for storing or retrieving data. The data bus may be configured to transfer data to and from identified memory locations. In one embodiment of the invention, one or more lines of memory bus 130 may be configured to transfer control bits, address bits and/or data bits.

As discussed above, improving performance of the system 100 may involve operating the system at a higher clock speed. Alternatively or additionally, the bus 130 may be widened to include more address, data, and/or control lines, thereby increasing the amount of data transferred in parallel between the devices. However, increasing the clock speed and/or widening bus 130 may result in increased power consumption by the bus 130, which is undesirable.

Power may be consumed on each line of the bus 130 provided to drive a bit value from one device to another, for example, from CPU 110 to memory 120. The bit value may be associated with one of a plurality of logic states. For example, in a binary system, the bit value may be represented by one of a "logic 0" bit or "logic 1" bit. Different voltage and/or current values may be associated with each logic state to allow devices to differentiate between different logic states. Because different logic states are associated with different voltages and/or currents, it follows that different amounts of power may be necessary for driving bits of different logic states on bus 130.

In one embodiment, driving logic 0 bit on a data line of bus 130 may require a greater amount of power than driving a logic 1 bit. In a system where the data bus 130 is widened to improve performance, it is likely that a majority of the data lines may drive logic 0 bits, thereby increasing power consumption. Accordingly, it may be more desirable to transfer logic 1 bits on data bus 130 rather than logic 0 bits in order to conserve power.

Another problem associated with transferring data between devices at high clock speeds is that switching from one logic state to another on a data line may generate noise and require additional power. For example, a particular data line of bus 130 may transfer a first bit representing a logic 1. In a subsequent transmission, the data line may transfer second bit representing a logic 0. Because driving different logic states require different amounts of power, toggling between logic states on a data line may require additional power. Furthermore, at high clock speeds, such toggling may generate noise that may result in erroneous transmissions. Accordingly, it is desirable to minimize the toggling of bits on the data lines of bus 130.

Data bus inversion may allow reduction in power consumption by a bus connecting two system devices. The data bus inversion Direct Current (hereinafter referred to as DBI DC) method may involve comparing a plurality of parallel bits transferred over the data bus 130 to a reference logic state. For example, in an exemplary embodiment, data bus 130 may comprise eight parallel data lines configured to transfer eight parallel bits of data at a time. Each of the eight parallel bits of data may be one of logic state 0 or logic state 1.

In one embodiment of the invention, CPU 110 and Memory 120 may each include a comparison circuit and one or more mode registers. For example, CPU 110 may include a comparison circuit 111 and a mode register 112. Memory 120 may include a comparison circuit 121 and a mode register 122. The comparison circuit may determine a Data Bus Inversion (DBI) mode of operation for a respective device. The mode registers may store one or more values that facilitate determination of a DBI mode of operation. If data is inverted by a system device based on a selected DBI mode of operation, the system device may assert a DBI enable signal, as illustrated in FIG. 1. The comparison circuit, mode registers, and data bus inversion modes are discussed in greater detail below.

Figure 2:
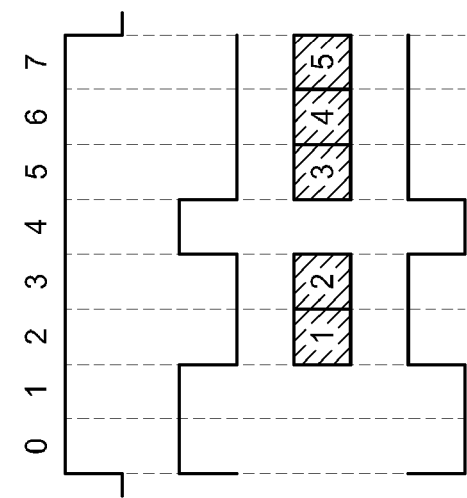
FIG. 2 illustrates data bus inversion DC (DBI DC) according to an embodiment of the invention.

In one embodiment, the plurality of parallel bits may be compared to a reference logic state to determine a number of bits (of the parallel bits) of a particular logic state. FIG. 2 illustrates DBI DC according to an embodiment of the invention. As illustrated in FIG. 2, a current byte 201 (bits 0-7) may include eight bits, each of which are one of logic 0 or logic 1. Particularly, in current byte 201 illustrated in FIG. 2, bits 0, 1, and 4 are logic 1, and bits 2, 3, and 5-7 are logic 0.

Each of the bits of current byte 201 may be compared to a reference logic state. For example, current byte 201 may be compared to the high level byte (logic 1) 202 to determine the number of logic 0 bits. In a particular embodiment, the number of logic 0 bits may be determined by subtracting the current byte 201 from the high level byte 202. The difference 203 between high level byte 202 and current byte 201 is illustrated in FIG. 2. The comparison between the current byte and the high level byte to determine the number of bits of a particular logic state may be performed by a comparison circuit of a system device. For example, referring back to FIG. 1, comparison circuits 111 and 121 are provided in each of the devices 110 and 120 respectively.

Returning to FIG. 2, the difference 203 indicates that there are five logic 0 bits in the current byte 201. Because the logic 0 bits represent a majority of the plurality of bits (i.e., greater than 4, in this case), the plurality of data bits may be inverted to conserve power. In other words, as discussed earlier, driving logic 0 bits may consume more power. Accordingly, if a majority of the plurality of data bits are logic 0 bits, the plurality of data bits may be inverted to reduce the number of logic 0 bits, thereby conserving power.

FIG. 2 illustrates inversed byte 204 after DBI DC inversion. As illustrated, bits 0, 1, and 4 are logic 0 and bits 2, 3, and 5-7 are logic 1. Because a majority of bits of inversed byte 204 are logic 1 bits, relatively lower power will be required to transfer inversed byte 204. In one embodiment, data bus 130 may include a DBI DC enable signal to indicate, to a device receiving inversed byte, that the received byte has been inversed using the DBI DC method. In alternative embodiments, a transferred byte may include an enable bit, wherein the enable bit indicates whether the bits in the byte have been inversed.

If, on the other hand, it is determined that the majority of bits are not logic 0, the current byte 201 may not be inversed and the DBI DC enable signal set accordingly. While logic 0 states are described as consuming greater power during transmission, one skilled in the art will recognize that the inverse may be true. In other words, in other embodiments, transmitting logic 1 bits may consume greater power. Accordingly, the DBI DC method may be adapted to reduce the number of logic 1 bits transmitted using steps similar to the ones described above.

Furthermore, while a comparison of the current byte with a high level logic 1 reference byte is disclosed in FIG. 2, embodiments of the invention are not so limited. In alternative embodiments, the current byte 201 may be compared with a logic 0 reference byte to determine a number of bits of a particular logic state.

Another data bus inversion technique is the data bus inversion Alternate Current (hereinafter referred to as DBI AC) method, which may involve comparing a current byte to an immediately previously transmitted byte.

Figure 3:
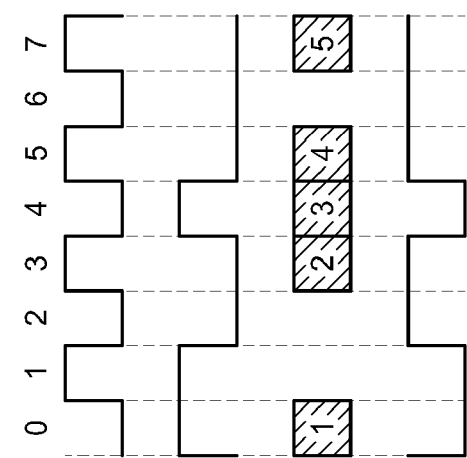
FIG. 3 illustrates data bus inversion AC (DBI AC) according to an embodiment of the invention.

FIG. 3 illustrates DBI AC according to an embodiment of the invention. As illustrated in FIG. 3 a current byte 301 (bits 0-7) may include eight bits, each of which are one of a logic state 0 or logic state 1. Illustratively, in current byte 301, bits 0, 1, and 4 are logic 1, and bits 2, 3, and 5-7, are logic 0.

Each of the bits of current byte 301 may be compared to the immediately previously transmitted byte 302 by a comparison circuit, for example, comparison circuit 111 or 121 (See FIG. 1). Bits 1, 2, 4, and 6 of previous byte 302 in FIG. 3 are logic 0, while bits 1, 3, 5, and 7 are logic 1. The previous byte 302 may be compared to the current byte 301 to determine a number of bits that are toggled in current byte 301 with respect to previous byte 302. In a particular embodiment, the current byte 301 may be subtracted from the previous byte 302 to determine the number of toggled bits.

Toggling a bit, as described herein, generally refers to changing a bit value driven on a particular bit line of a bus. For example, each device of a system connected to a bus may include one or more drive circuits configured to drive a bit value on a particular bit line of a system bus. In a first transmission, the drive circuits may drive a first bit value, for example, a logic 0 bit. If a subsequently driven bit value is different from an immediately previously driven bit, for example, logic 1, the drive circuits may have to be reconfigured logic 1 bit, the drive circuits may have to be reconfigured to drive the different bit.

Referring to FIG. 3, the difference 303 between previous byte 302 and current byte 301 indicates that five current byte 301 bits that have to be toggled to match previous byte 302. Particularly, bits 0, 3-5, and 7 will have to be toggled, as illustrated. Because a majority of the plurality of bits (i.e., greater than 4, in this case), will have to be toggled, the plurality of data bits may be inverted to conserve power and reduce noise. In other words, because toggling bits on a data line may increase consumption of power and generate noise, the DBI AC method is used to minimize the number of bits that need to be toggled. Accordingly, if a majority of the plurality of data bits need to be toggled, the plurality of data bits may be inverted to conserve power and reduce noise.

FIG. 3 illustrates inversed byte 304 after DBI AC inversion. As illustrated, bits 0, 1, and 4 are logic 0 and bits 2, 3, and 5-7 are logic 1. Therefore, only 3 bits of the previous byte (1, 2, and 6) will need to be toggled to derive the inversed byte 304. In one embodiment, data bus 130 may include a DBI AC enable signal to indicate, to a device receiving the inversed byte, that the received byte has been inversed using the DBI AC method.

Figure 4:
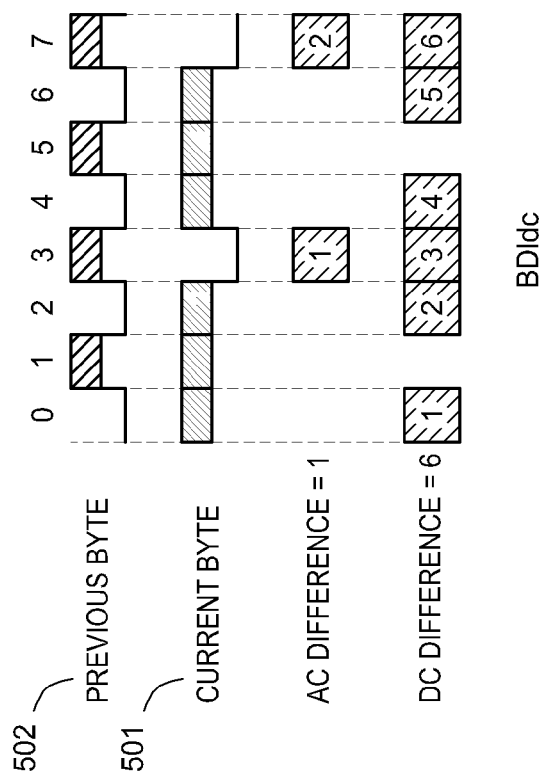
FIG. 4 illustrates a comparison between DBI DC and DBI AC according to an embodiment of the invention.

While DBI DC and DBI AC each facilitate reduction in power consumption, it may be more advantageous to use one method over the other based on the data that is to be transmitted. FIG. 4 illustrates an example where using DBI DC is more advantageous than using DBI AC. As illustrated in FIG. 4, bit 1 of a current byte 401 may be logic 1 and bits 0, and 2-7 may be logic 0. Further, as illustrated, bits 1 and 5 of a previous byte 402 may be logic 1, and bits 0, 2-4, 6, and 7 may be logic 0. Using the DBI AC method, only one bit, i.e. bit 5, of the current byte 401 will have to be toggled to match the previous byte 402. Accordingly, under the DBI AC scheme current byte 401 will not be inverted.

However, using the DBI DC method for current byte 401 will require inversion because a majority of bits of current byte 401 are logic 0. For example, 7 bits (bits 0, and 2-7) are logic 0, as illustrated. Therefore, because transmitting a large number of logic 0 bits may result in increased power consumption, it may be more desirable to use DBI DC for transmitting current byte 401.

Figure 5:
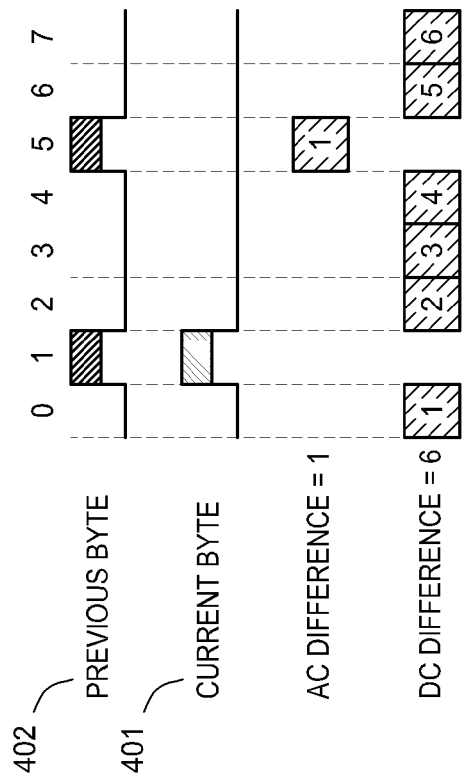
FIG. 5 illustrates another comparison between DBI DC and DBI AC according to an embodiment of the invention.

FIG. 5 illustrates an example where using DBI AC is more advantageous than using DBI DC. As illustrated in FIG. 5, bits 0-2 and 4-6 of current byte 501 may be logic 1 and bits 3 and 7 may be logic 0. Further, as illustrated, bits 1, 3, 5, and 7 of a previous byte 502 may be logic 1, and bits 0, 2, 4, and 6 may be logic 0. Using the DBI DC method, only two bits, i.e. bits 3 and 7, are logic 0. Accordingly, under the DBI DC scheme current byte 501 will not be inverted.

However, using the DBI AC method for current byte 501 will require inversion because a majority of bits of previous byte 501 will have to be toggled to match previous byte 502. For example, 6 bits (bits 0, 2-4, 6, and 7) will have to be toggled, as illustrated. Therefore, because a majority of the bits will have to be toggled, increased power consumption and noise generation may result. Therefore, it may be more desirable to use DBI AC for transmitting current byte 501.

In one embodiment, each device of a system may include a mode register including mode selection data. For example, referring back to FIG. 1, devices 110 and 120, each have respective mode registers 112 and 122. Mode registers 112 and 122 may store control information that selects one of a DBI DC and DBI AC mode of operation for the device. The mode of operation of each device may be selected by the device itself or a central processing unit (CPU) of the system.

In some embodiments, a device may switch between different DBI modes of operation to more advantageously conserve power. However, it may not be feasible to select a DBI mode of operation for each packet of data to be transmitted between devices. For example, if a DBI mode is selected for each packet of data transmitted, the device may have to be stalled while the DBI mode is switched, thereby adversely affecting performance. Embodiments of the invention provide efficient methods and articles of manufacture for selecting and switching between different DBI modes of operation.

In some embodiments, the selection of a DBI mode of operation for the device may depend on an operation mode of the device. For example, in one embodiment, each device may be configured to operate in one of a plurality of modes of operation including, for example, a single mode and self adapted mode. In the single mode, the DBI mode of operation of a device may be selected by a processing unit, for example, CPU 110 illustrated in FIG. 1. Accordingly, CPU 110 may be configured to update the mode register of each device in the system 100. Alternatively, each device may itself determine an appropriate DBI mode of operation. When a device determines it's respective mode of operation, it may be said to be operating in a self adapted mode.

In one embodiment, the comparison circuit of a device or a CPU may determine the appropriate DBI mode of operation for the device or CPU. Accordingly, the comparison circuit may be configured to update the mode register to select a DBI mode of operation for the device. In some embodiments, the DBI mode register, or alternatively a separate mode register, may also store control information that determines whether the device operates in single mode or self adapted mode.

Figure 6:
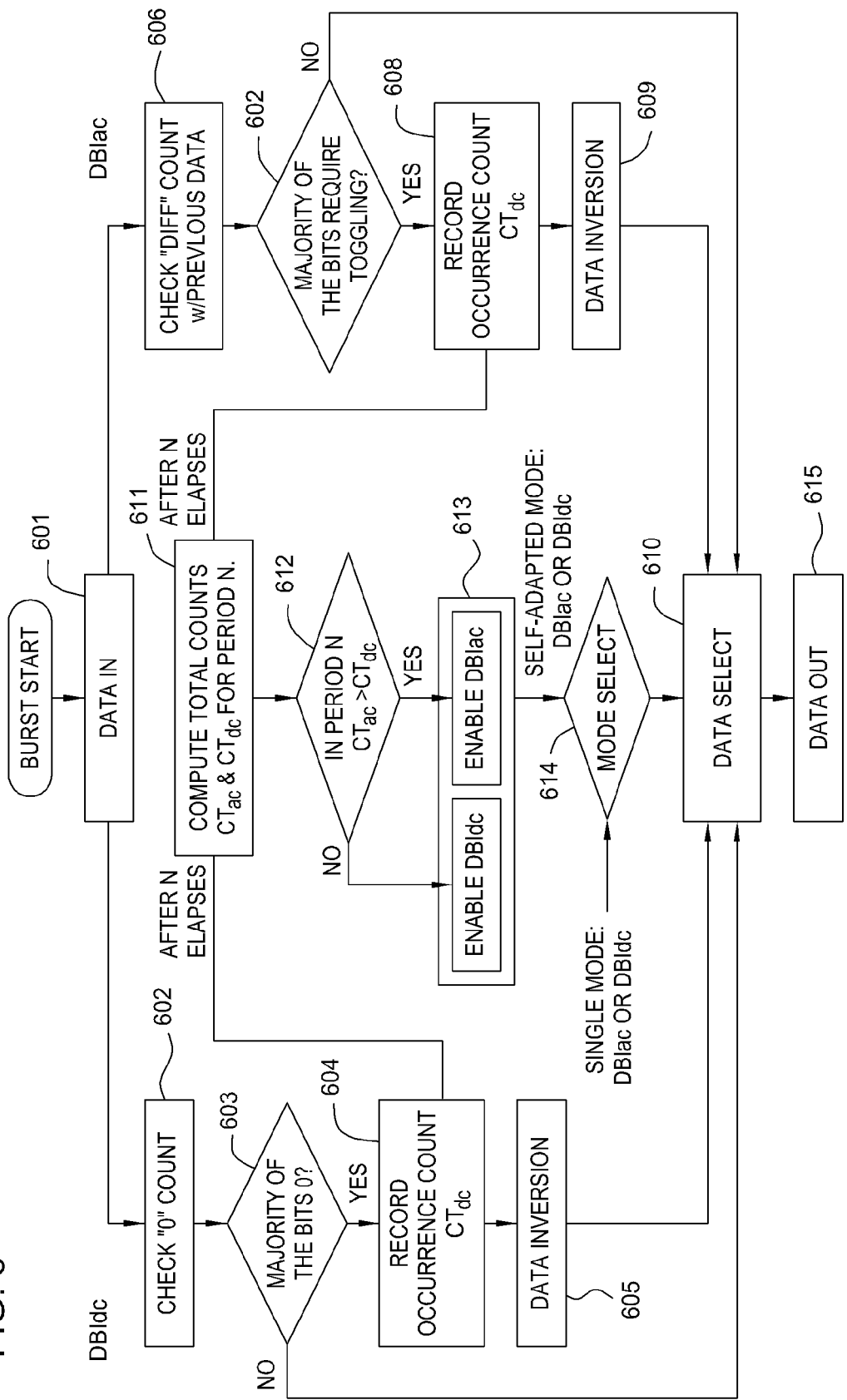
FIG. 6 illustrates a flow diagram of exemplary operations performed by a comparison circuit according to an embodiment of the invention.

FIG. 6 illustrates a flow diagram of exemplary operations performed by a comparison circuit, for example, comparison circuit 111 and/or comparison circuit 121 illustrated in FIG. 1, to perform data bus inversion according to an embodiment of the invention. The operations may begin in step 601 by receiving data to be transmitted to a device. Thereafter, the comparison circuit may perform DBI DC and DBI AC analysis in parallel. For example, in steps 602-605, the comparison circuit may perform DBI DC analysis, and in steps 606-609, the comparison circuit may perform DBI AC analysis, as illustrated in FIG. 6.

The DBI DC analysis may correspond to the DBI DC analysis illustrated and described with reference to FIG. 2 above. For example, in step 602, the comparison circuit may determine a total number of logic 0's to be transmitted for the received data. In step 603, the comparison circuit may determine if a majority of bits are logic 0. If a majority of the bits are logic 0, then the comparison circuit may record the number of logic 0 bits (CTdc) that will have to be inverted in step 604. Furthermore, in step 605, the comparison circuit may invert the data received. If, on the other hand, it is determined in step 603 that a majority of bits are not logic 0, then the data is not inverted. The data, whether inverted or not in step 605, is selected based on a device mode of operation in step 610 (discussed further below), as illustrated in FIG. 6.

The DBI AC analysis may correspond to the DBI AC analysis illustrated and described with reference to FIG. 3 above. For example, in step 606, the comparison circuit may determine a total number of bits of previous data that will have to be toggled to derive the data received in step 601. In step 607, the comparison circuit may determine if a majority of bits of the previous data will have to be toggled. If a majority of the bits will have to be toggled, then the comparison circuit may record the number of bits that will have to be toggled (CTac) in step 608. Furthermore, in step 609, the comparison circuit inverts the data received. If, on the other hand, it is determined in step 607 that a majority of bits will not have to be toggled, then the data is not inverted. The data, whether inverted or not in step 609, is selected based on a device mode of operation in step 610 (discussed further below), as illustrated in FIG. 6.

In one embodiment, a running count for CTac and CTdc may be maintained. For example, in step 611, the comparison circuit may compute a total counts CTac and CTdc for multiple packets of data received by the comparison circuit. Accordingly, in step 611, the comparison circuit may be configured to increment a total count for each of counts CTac and CTdc each time a count CTac and CTdc is computed in steps 604 and 608.

In step 612, the comparison circuit may compare the total count for each of CTac and CTdc for a predetermined period N. If it is determined that the total count for CTac is greater than the total count for CTdc, then it may be more advantageous to operate in DBI AC mode. In some embodiment, when the CTac count is larger, it may suggest that the nature of the data stream tends to have temporal differences, therefore DBI AC may reduce the differences on the bus, thereby reducing noise & power consumption. Accordingly, in step 613, the mode register may be updated to enable operation in DBI AC mode. If, however, it is determined that the total count for CTac is lesser than the total count for CTdc, then it may be more advantageous to operate in DBI DC mode. Accordingly, in step 613, the mode register may be updated to enable operation in DBI DC mode. If the CTac count is equal to the CTdc count any one of the DBI DC and DBI AC mode may be selected.

In one embodiment of the invention, the period N may be selected by a CPU of the system. The period N may be stored in the mode register of each device. While maintaining a total count for CTac and CTdc for a period N is described herein, any other variable other than time may also be used to maintain a cumulative total of CTac and CTdc. For example, in one embodiment, a total count for CTac and CTdc may be computed for a predetermined number of data packets X received by the comparison circuit. In one embodiment, the predetermined number X may be selected by a CPU.

While comparing the total counts CTac and CTdc to determine the greater value is described herein, embodiments of the invention are not limited to this implementation. In alternative embodiments, the DBI DC mode of operation may be more effective at saving power than the DBI AC mode, or vice versa. Accordingly, in step 612, the comparison circuit may be configured to use any reasonable comparison of the total CTac and CTdc counts in order to determine an appropriate DBI mode of operation. For example, in some embodiments, the DBI DC mode may be selected if the count CTdc is greater than the count CTac by a predetermined threshold number.

In step 614, the comparison circuit may determine whether the device is configured to operate in single mode or self adapted mode based on, for example, control information stored in a mode register. If the device is configured to operate in single mode, in step 610, the comparison circuit may select data associated with a DBI mode of operation determined by a CPU. If, however, it is determined that the device is configured to operate in self adapted mode, then, in step 610, the comparison circuit may select data associated with the DBI mode of operation enabled in step 613. In step 615, the data selected in step 610 may be driven on to a bus, for example, bus 130 of FIG. 1. If data is inverted, a data enabled signal may be asserted on a bus to notify a receiving device that the data is inverted.

In some embodiments, if a device is configured to operate in a single mode, the comparison circuit may not perform the steps 602-613 described in FIG. 6. In alternative embodiments, the comparison circuit may perform steps 602-613 even if the device is operating in single mode. Therefore, if the device is switched from single mode to self adapted mode, the device may easily and quickly determine a DBI mode of operation based on the computed totals of CTac and CTdc.

Figure 7:
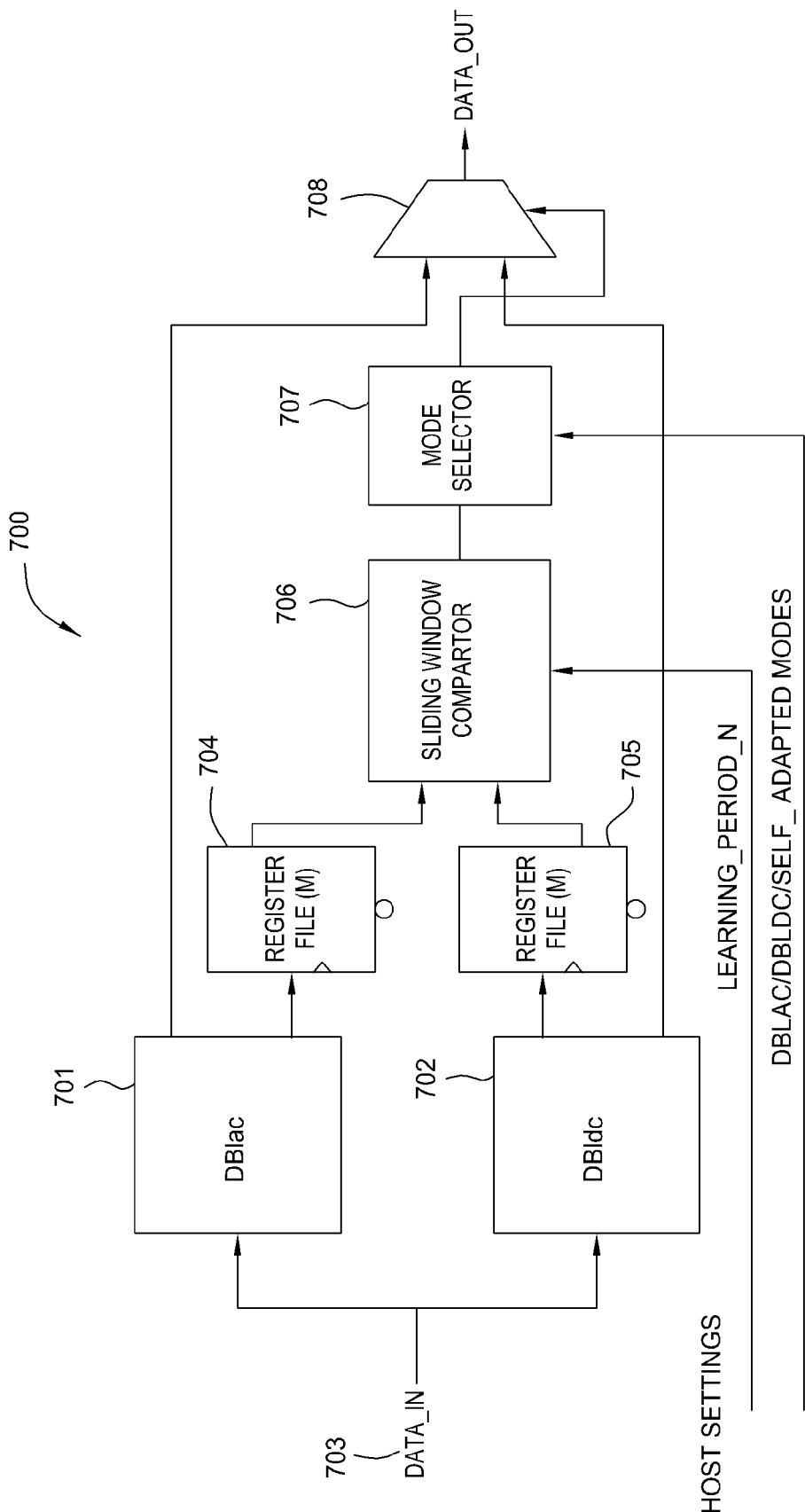
FIG. 7 illustrates a block diagram of components of an exemplary comparison circuit according to an embodiment of the invention.

FIG. 7 illustrates components of a comparison circuit 700 according to an embodiment of the invention. Comparison circuit 700 may correspond to any one or the comparison circuits 111 and 121 illustrated in FIG. 1. As illustrated in FIG. 7, the comparison circuit may comprise a DBI AC analysis circuit 701 and a DBI DC analysis circuit 702. DBI AC analysis circuit 701 may be configured to receive data 703 and perform the steps 606-609 illustrated in FIG. 6. In other words, DBI AC analysis circuit 701 may be configured to perform DBI AC analysis on data 703. DBI DC analysis circuit 702 may be configured to receive data 703 and perform the steps 602-605 illustrated in FIG. 6. In other words, DBI DC analysis circuit 702 may be configured to perform DBI DC analysis on data 703.

The comparison circuit may also contain a register file 704 associated with DBI AC circuit 701 and a register file 705 associated with the DBI DC circuit 702. Each of the register files 704 and 705 may be configured to store inverted data received from an associated analysis circuit 701 or 702. Furthermore, each of register files 704 and 705 may be configured to store a respective count CTac or CTdc for the data 703 and a total count CTac or CTdc for multiple packets of data received. For example, register file 704 may be configured to store inverted data 703 received from DBI AC analysis block 701, a count of the total number of bits that need to toggled CTac for data 703 and a total count CTac for multiple plackets of data received.

In some embodiments, the register file 704, or a portion thereof may be used as a buffer for data 703 received by the device. Therefore, the DBI AC circuit 701 may be configured to perform DBI AC analysis by accessing for each of a plurality of bits of data to be sent over the bus, a plurality of bits of data to be sent immediately previous to the plurality of bits of data. In some embodiments, the register file 705 may contain a reference byte, for example, a reference high byte, to facilitate performing of DBI DC analysis by the DBI DC circuit 702.

The comparison circuit 700 may also comprise a sliding window comparator 706 for determining an appropriate DBI mode of operation for the device. Sliding window comparator may compare multiple packets of data to determine the most advantageous DBI mode of operation. For example, in one embodiment, the sliding window comparator 706 may determine a total count CTac and CTdc for multiple data packets received over a period N and determine whether CTac is greater than CTdc. If CTac is greater than CTdc then sliding window comparator 706 may be configured to enable the DBI AC mode of operation. On the other hand if CTac is lesser that CTdc, then the sliding window generator 706 may be configured to enable the DBI DC mode of operation. Accordingly, sliding window comparator 706 may be configured to update the mode register that stores the DBI mode selection control data.

In one embodiment, sliding window comparator 706 may be configured to access a mode register to determine the period N. Accordingly, the sliding window comparator 706 is shown receiving the period N as an input in FIG. 7. The period N may be selected by a CPU, as discussed above. Alternatively, in some embodiments, sliding window comparator 706 may be configured to compare a total count for CTac and CTdc for a predetermined X number of data packets, as discussed earlier.

The comparison circuit 700 may also include a mode selector 707. Mode selector 707 may determine whether the device is configured to operate in single mode or self adapted mode. In one embodiment, a mode register may contain control information that determines the mode of operation of the device. Accordingly, mode selector 707 receives the device mode of operation as an input (from the mode register according to one embodiment). If the device is configured to operate in single mode, the mode selector 707 may select data received from the sliding window comparator 707 that is associated with a DBI mode selected by the CPU. If the device is configured to operate in self adapted mode, the mode selector 707 may select data received from the sliding window comparator 706 that is associated with a DBI mode enabled by the sliding window comparator 706.

In one embodiment, the mode selector 707 may provide a selection signal for selecting data based on a DBI mode of operation. For example, in some embodiments, the mode selector 707 may receive data inverted according to DBI AC and DBI DC. The mode selector may generate a DBI mode select signal, which may be used by a multiplexor to select data according to DBI mode of operation determined by the sliding window comparator 706.

The comparison circuit may further include a data selector 708. Data selector 708 may select one of inverted data received from the mode selector 707, and non inverted data received from DBI AC analysis block 701 and DBI DC analysis block 702.

By allowing a DBI mode of operation to be selected based on an analysis of multiple data packets to be transmitted from a device, embodiments of the invention allow conservation of power consumed by a bus connecting system devices. Furthermore, the noise on the bus created as a result of toggling bits is also reduced.

While the foregoing is directed to embodiments of the present invention, other and further embodiments of the invention may be devised without departing from the basic scope thereof, and the scope thereof is determined by the claims that follow.

What is claimed is:

1. A method for transmitting data from a first device to a second device over a bus connecting the first device and second device, comprising:
   receiving a plurality of bits of data to be transmitted from the first device to the second device;
   determining a first number representing a total number of bits of a first logic state in the plurality of bits of data that will be inverted based on data bus inversion DC (DBI DC);
   determining a second number representing a total number of bits in the plurality of bits of data that will be toggled based on DBI AC;
   operating the first device in a DBI DC mode if the first number is smaller than the second number; and
   operating the first device in a DBI AC mode if the first number is greater than the second number.

2. The method of claim 1, wherein the plurality of bits are received over a period N, wherein the period N is determined by a central processing unit (CPU).

3. The method of claim 1, wherein a predetermined number of plurality of bits are received sequentially by the first device, the predetermined number being selected by a CPU.

4. The method of claim 1, further comprising:
   determining whether the first device is configured to operate in a single mode, wherein, in the single mode, the first device is configured to operate in a data bus inversion mode selected by a CPU; and
   operating the first device in the data bus inversion mode selected by the CPU if the first device is configured to operate in the single mode.

5. The method of claim 1, further comprising updating a mode register, wherein the mode register stores control information, the control information determining a DBI mode of operation for the first device.

6. The method of claim 1, wherein the first device is a central processing unit.

7. The method of claim 1, wherein the first device is a memory device.

8. An electronic device coupled to a system bus comprising a comparison circuit configured to:
- identify a plurality of bits of data to be transmitted from the device;
- determine a first number representing a total number of bits of a first logic state in the plurality of bits of data that will be inverted based on data bus inversion DC (DBI DC);
- determine a second number representing a total number of bits in the plurality of bits of data that will be toggled based on DBI AC;
- enable the device to operate in a DBI DC mode if the first number is smaller than the second number; and
- enable the device to operate in a DBI AC mode if the first number is greater than the second number.

9. The electronic device of claim 8, wherein the comparison circuit is further configured to:
- determine whether the device is configured to operate in a single mode, wherein, in the single mode, the device is configured to operate in a data bus inversion mode selected by a CPU; and
- operate the device in the data bus inversion mode selected by the CPU if the device is configured to operate in the single mode.

10. The electronic device of claim 9, wherein the device further comprises a mode register comprising control information, the control information selecting a DBI mode of operation for the device.

11. The electronic device of claim 10, wherein the CPU is configured to update the control information, the control information determining whether the first device is configured to operate in single mode.

12. The electronic device of claim 8, wherein the comparison circuit is configured to receive the plurality of bits over a period N, wherein the period N is determined by a CPU.

13. The electronic device of claim 8, wherein the comparison circuit is configured to determine the first number and second number for a predetermined number of plurality of bits sequentially received by the device, the predetermined number being selected by a CPU.

14. The electronic device of claim 8, wherein the device is a CPU.

15. The electronic device of claim 8, wherein the device is a memory device.

16. A system, comprising a first device and a second device connected to the first device via a bus, wherein the first device comprises a comparison circuit configured to:
- receive a plurality of bits of data to be transmitted from the first device to the second device;
- determine a first number representing a total number of bits of a first logic state in the plurality of bits of data that will be inverted based on data bus inversion DC (DBI DC);
- determine a second number representing a total number of bits in the plurality of bits of data that will be toggled based on DBI AC of each of the plurality of data packets;
- enable the first device to operate in a DBI DC mode if the first number is smaller than the second number; and
- enable the first device to operate in a DBI AC mode if the first number is greater than the second number.

17. The system of claim 16, wherein the comparison circuit is further configured to:
- determine whether the first device is configured to operate in a single mode, wherein, in the single mode, the first device is configured to operate in a data bus inversion mode selected by a CPU; and
- operate the first device in the data bus inversion mode selected by the CPU if the first device is configured to operate in the single mode.

18. The system of claim 17, wherein the first device further comprises a mode register comprising control information, the control information selecting a DBI mode of operation for the first device.

19. The system of claim 18, wherein the CPU is configured to update the control information, the control information determining whether the first device is configured to operate in single mode.

20. The system of claim 16, wherein the first device is a CPU.

21. The system of claim 16, wherein the first device is a memory device.

22. The system of claim 16, wherein the comparison circuit is configured to receive the plurality of bits of data over a period N, wherein the period N is determined by a CPU.

23. The system of claim 16, wherein the comparison circuit is configured to determine the first number and second number for a predetermined number of bits of data sequentially received by the first device, the predetermined number being selected by a CPU.

24. An integrated circuit comprising:
- a data bus inversion (DBI) DC circuit configured to receive a plurality of data bits and compute a first number representing a total number of data bits of the plurality of data bits that will be inverted based on DBI DC;
- a DBI AC circuit configured to receive the plurality of data bits and compute a second number representing a total number of data bits of the plurality of data bits that will be inverted based on DBI AC; and
- a comparison circuit configured to determine a DBI in AC mode or DC mode of operation for the integrated circuit based on a comparison of the first number and the second number.

25. The integrated circuit of claim 24, wherein the DBI DC circuit is configured to invert the plurality of data bits based on DBI DC and, if the plurality of data bits are inverted, store the inverted plurality of data bits in a first register associated with the DBI DC circuit.

26. The integrated circuit of claim 24, wherein the integrated circuit further comprises a mode selection circuit, wherein the mode selection circuit is configured to determine whether the integrated circuit is configured to operate in a single mode, wherein, in the single mode, the integrated circuit is configured to operate in a data bus inversion mode selected by a CPU, and operate the integrated circuit in the data bus inversion mode selected by the CPU if the integrated circuit is configured to operate in the single mode.

27. The system of claim 24, wherein the DBI AC circuit is configured to invert the plurality of data bits based on DBI AC and, if the plurality of data bits are inverted, store the inverted plurality of data bits in a second register associated with the DBI AC circuit.

* * * * *